United States Patent [19]
Chen

[11] Patent Number: 6,125,068
[45] Date of Patent: Sep. 26, 2000

[54] MEMORY ACCESS CONTROL

[76] Inventor: Han-Ping Chen, P.O. Box 2871, Saratoga, Calif. 95070

[21] Appl. No.: 09/450,017

[22] Filed: Nov. 29, 1999

[51] Int. Cl.[7] .................................................. G11C 13/00
[52] U.S. Cl. .............................................. 365/200; 365/51
[58] Field of Search ................................. 365/51, 63, 200, 365/230.03

[56]  References Cited

U.S. PATENT DOCUMENTS 5,666,312  9/1997  Robertson ................................. 365/200

Primary Examiner—Terrell W. Fears

[57] ABSTRACT

A method and apparatus controls the memory access of memory devices in order to utilize partially defective memory devices to construct usable memory chip or module packages that meet the specification of a fully or partially functional package.

18 Claims, 11 Drawing Sheets

MEMORY ACCESS CONTROL

BACKGROUND OF THE INVENTION

This invention relates to semiconductor memory devices, memory chips, memory modules, and the handling of defective memory components.

Due to the yield limitation of semiconductor fabrication process, a semiconductor memory wafer usually contains defective memory devices. As the cell density of the semiconductor device increases, it is becoming harder to achieve high production yield.

During the device fabrication process, certain repairing process may be used to replace defective rows or columns in the memory cell array. However, there is a limit as to the capability of such repairing process. Some memory devices remain defective at the semiconductor die level after the fabrication process.

To repair the memory devices above the die level is a complex issue regarding the feasibility, efficiency, and performance.

BRIEF SUMMARY OF THE INVENTION

This invention proposes a method and apparatus to efficiently utilize partially defective memory devices to construct usable memory chip or module packages that meet the specification of a functional package.

This invention provides a method that maximizes the usage of non-defective memory data bits in the partially defective memory devices.

The present invention provides a method that simplifies the production and process of memory chips or modules.

This invention further provides a method to minimize or eliminate the initialization of the chips or modules.

DETAILED DESCRIPTION OF THE INVENTION

The present invention will be illustrated with some preferred embodiments.

Figure 1:
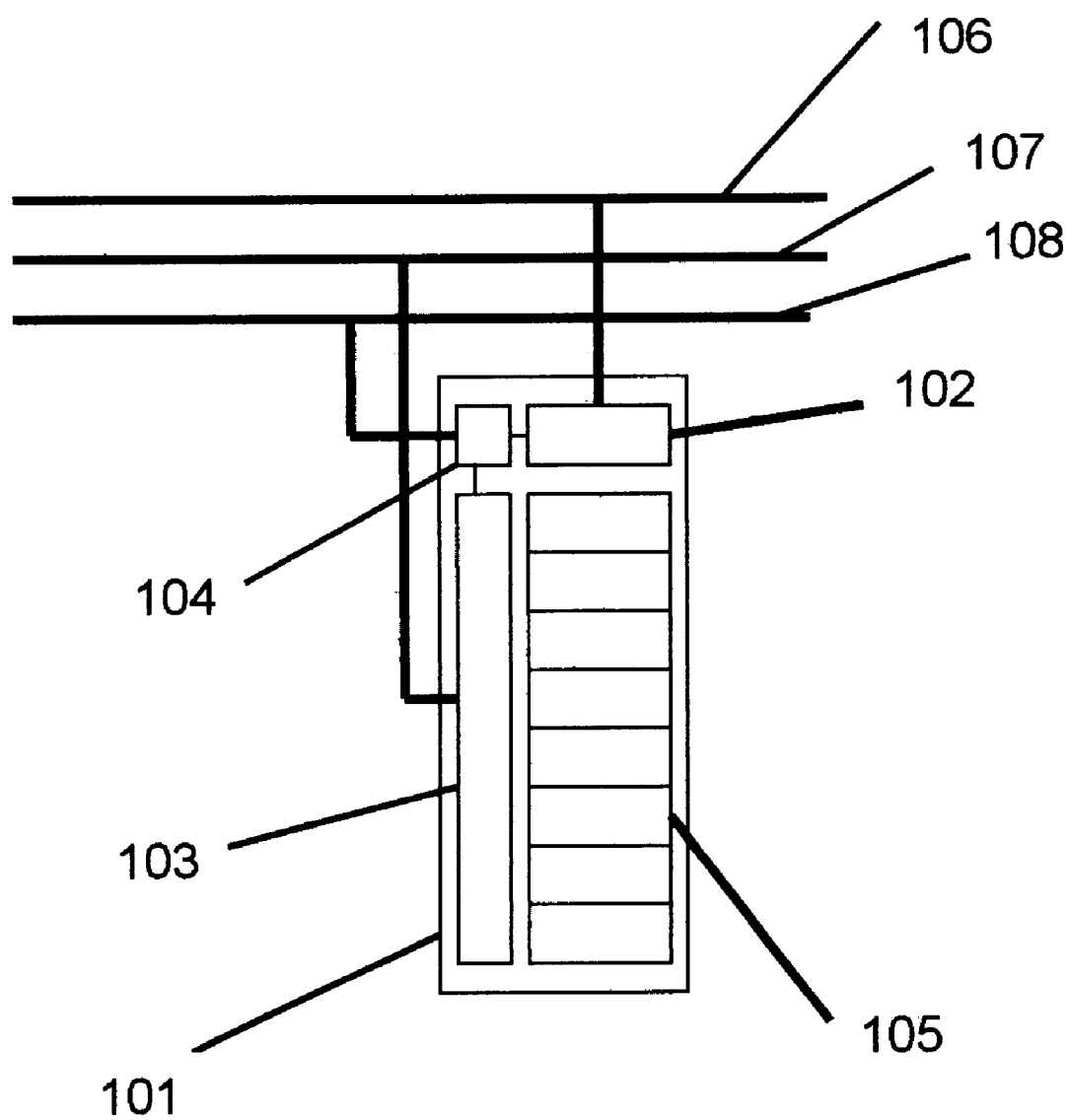
FIG. 1 is a diagram of a prior art memory chip.

FIG. 1 is a diagram of a prior art memory chip. The memory device 101 contains device data port 102, a memory address unit 103, and a memory control unit 104, and a memory cell array 105. The device data port 102 is connected to the chip data bus 106. The device address unit 103 is connected to the chip address bus 107. The device control unit 104 is connected to the chip control bus 108.

Figure 2:
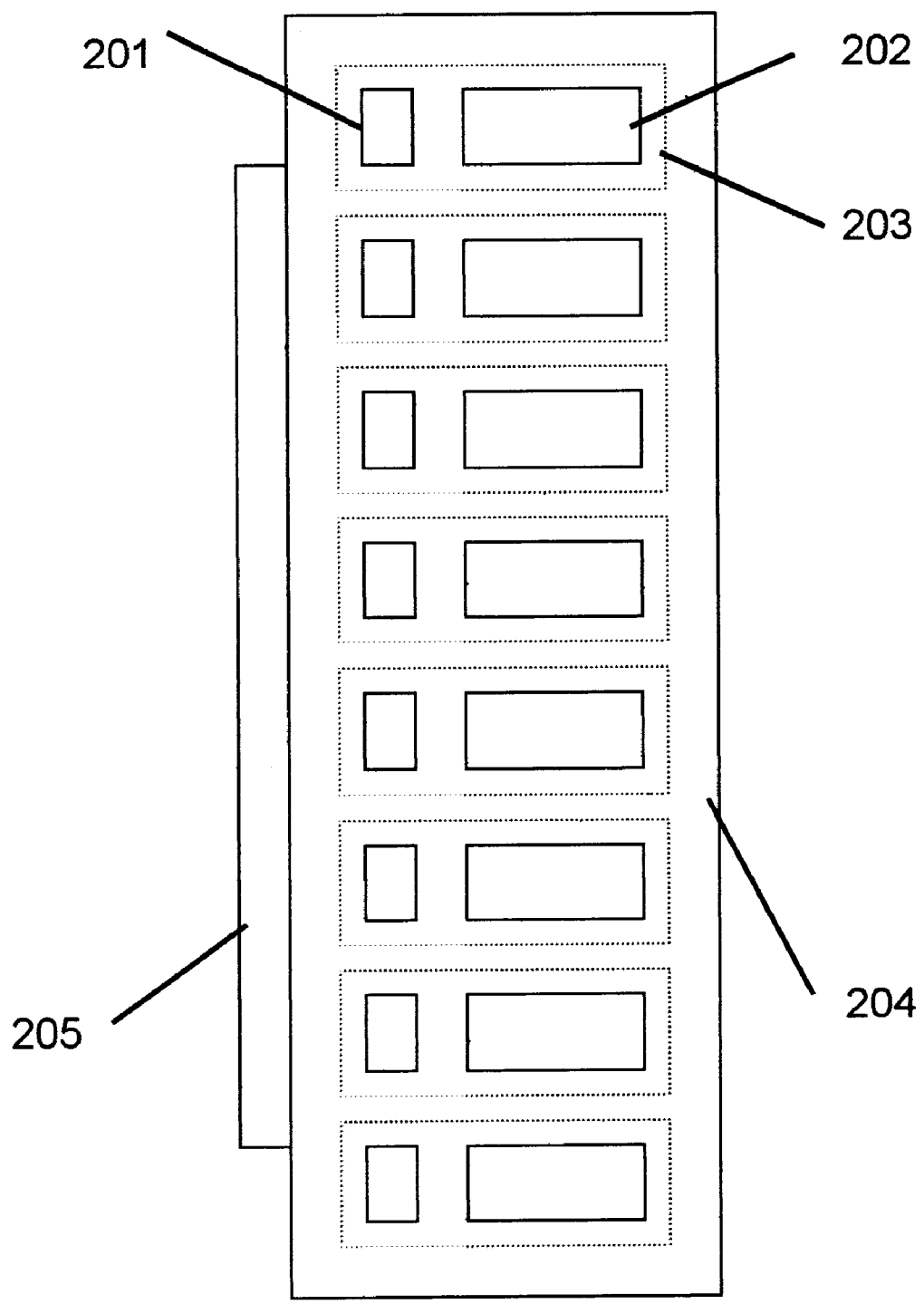
FIG. 2 is a diagram of a prior art memory module.

FIG. 2 is a diagram of a prior art memory module. The memory module data port 201 are connected to the corresponding chip data port of the memory chip 202. This combination constitutes a memory unit 203. This memory module contains a total of eight memory units. The module is built on a printed circuit board 204 with an edge connection 205 to interface with other system components.

Figure 3:
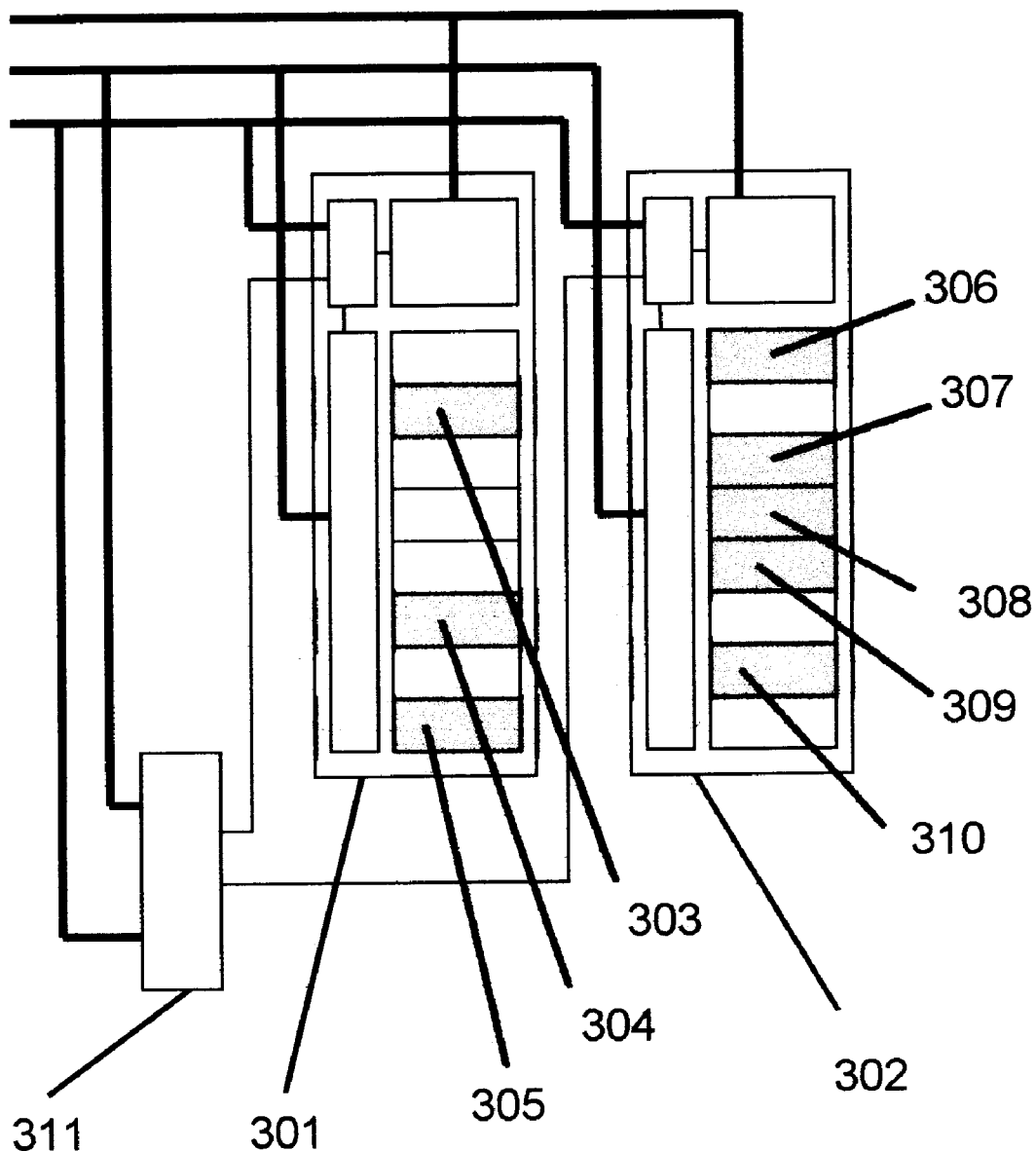
FIG. 3 shows a preferred embodiment of the present invention for a memory chip package.

FIG. 3 shows a preferred embodiment of the present invention for a memory chip package. In memory device 301, the memory cell array is divided into eight memory blocks. Memory device 301 contains defective memory cells within memory blocks 303, 304, and 305. Memory device 302 contains defective memory cells within memory blocks 306, 307, 308, 309, and 310, exactly the opposite of memory device 301. The memory access controller 311 controls the data input and output of the two memory units 301 and 302.

Figure 4:
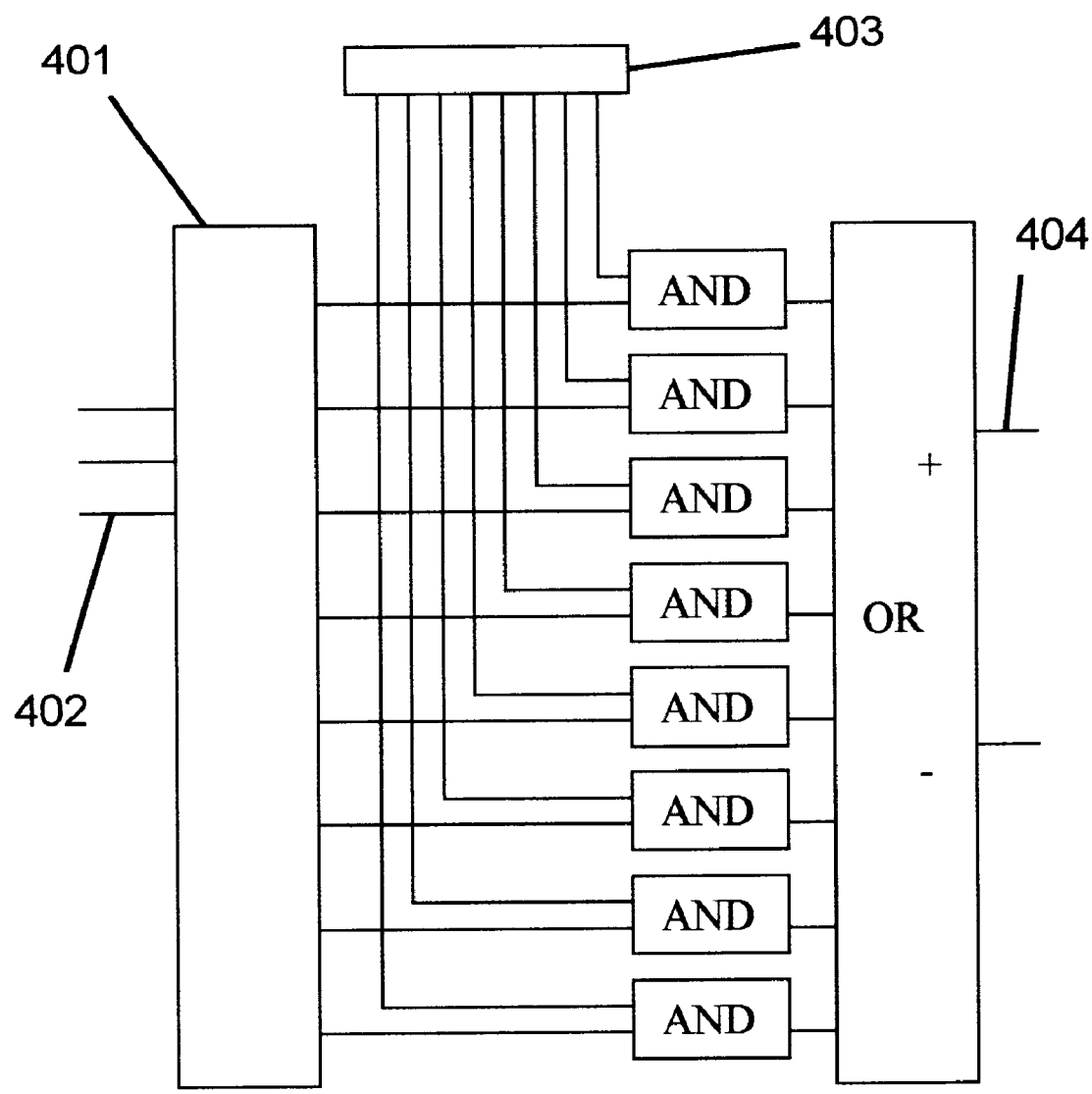
FIG. 4 shows a preferred embodiment of the present invention for a memory access controller.

FIG. 4 shows a preferred embodiment of a memory access controller for the memory chip package in FIG. 3. In this embodiment, the memory address space is divided into eight regions. Upon control signals, a decoder logic block 401 decodes three address lines 402 into eight address region lines. Each region line is logically AND with an enabling line from an address region enable setting 403. These region control lines are logically OR together to form an enable line 404 for a first group of memory units. The logical NOT of this signal is the enable signal for a second group of memory units.

Figure 5:
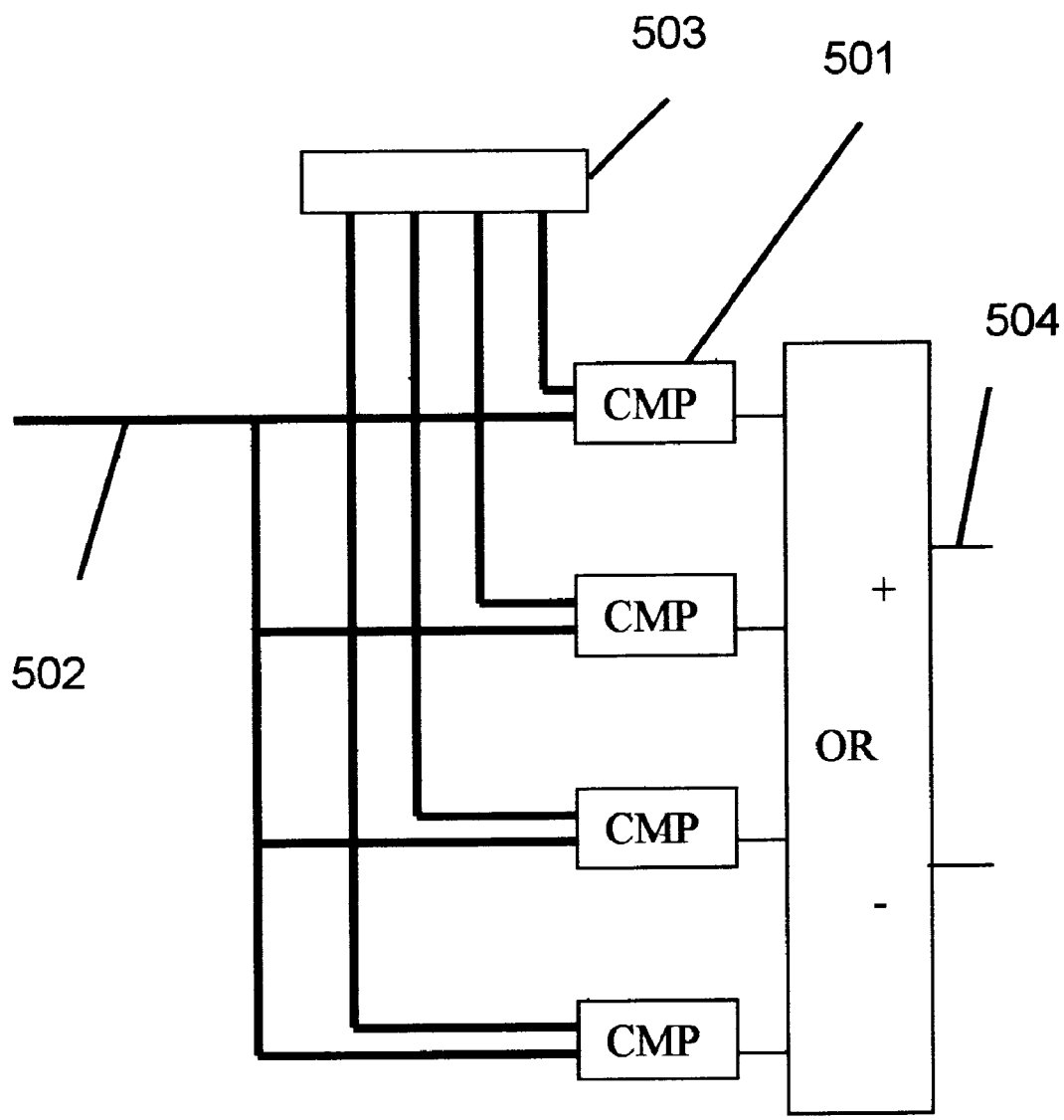
FIG. 5 shows another preferred embodiment of the present invention for a memory access controller.

FIG. 5 shows another preferred embodiment of a memory access controller for the memory chip package in FIG. 3. In this embodiment, the memory address space is also divided into eight regions. Also in this embodiment, we will enable the first group of memory units for up to four memory regions, which is half the total number of regions. Upon control signals, four comparing logic block 501 compares three address lines 502 with four sets of 3-bit memory region settings 503 into four region control lines. These region control lines are logically OR together to form an enable line 504 for a first group of memory units. The logical NOT of this signal is the enable signal for a second group of memory units.

Figure 6:
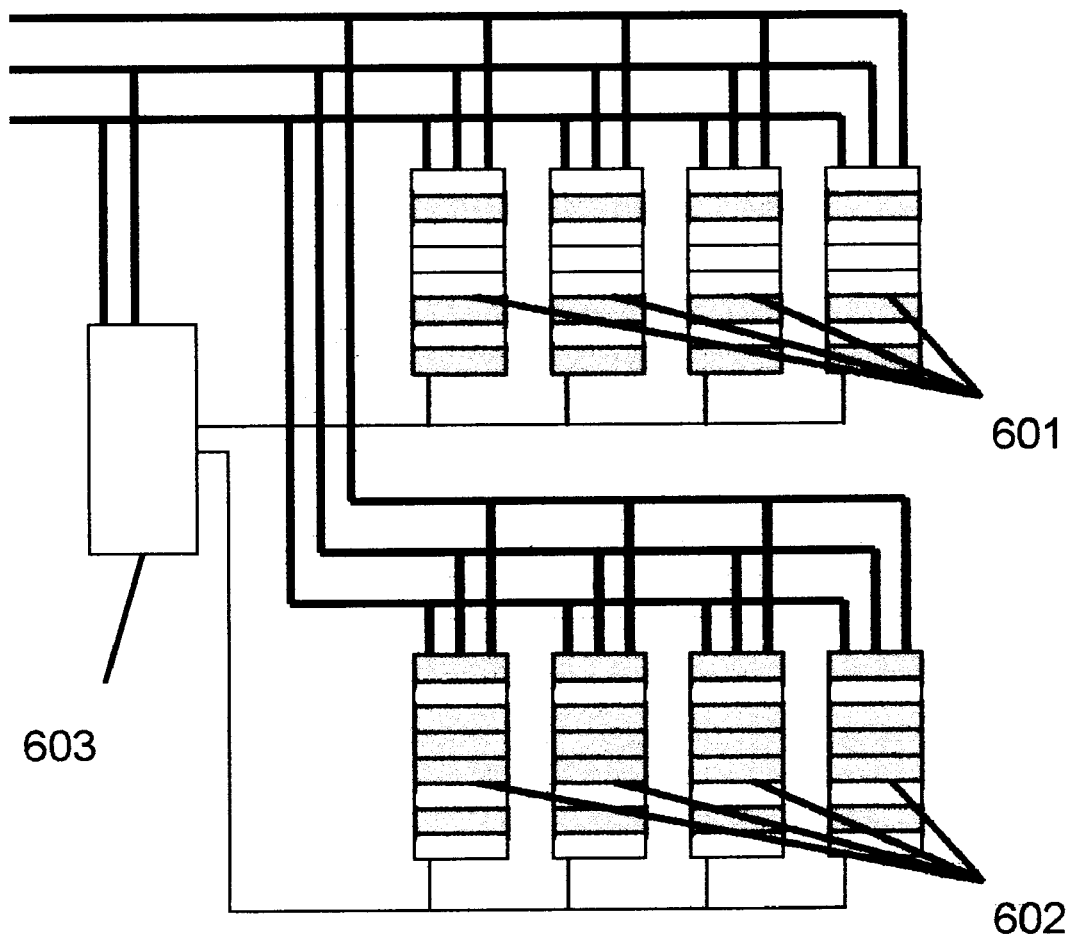
FIG. 6 shows a preferred embodiment of the present invention for a memory module package.

FIG. 6 shows a preferred embodiment of the present invention for a memory module package. The first group of memory chips contains four memory units 601. The second group of memory chips contains four other memory units 602. The memory access controller 603 controls the enabling of these two memory groups. The structure of the memory access controller 603 is as illustrated in FIG. 4 and FIG. 5.

Figure 7:
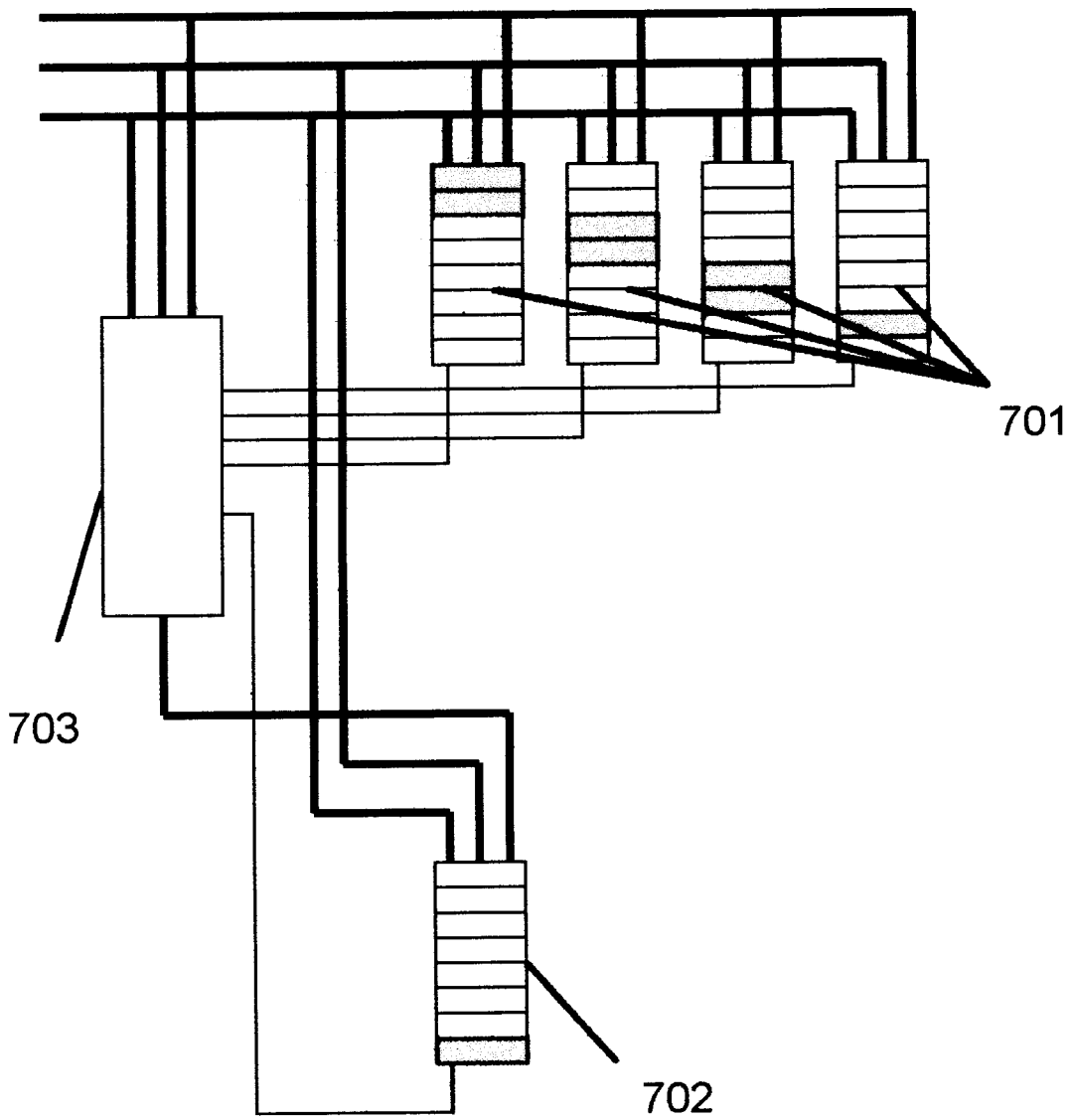
FIG. 7 shows another preferred embodiment of the present invention for a memory module package.

FIG. 7 shows another preferred embodiment of the present invention for a memory module package. The first group of memory chips contains four memory units 701. The second group of memory chips contains one memory unit 702. The memory access controller 703 controls the enabling of these two memory groups.

Figure 8:
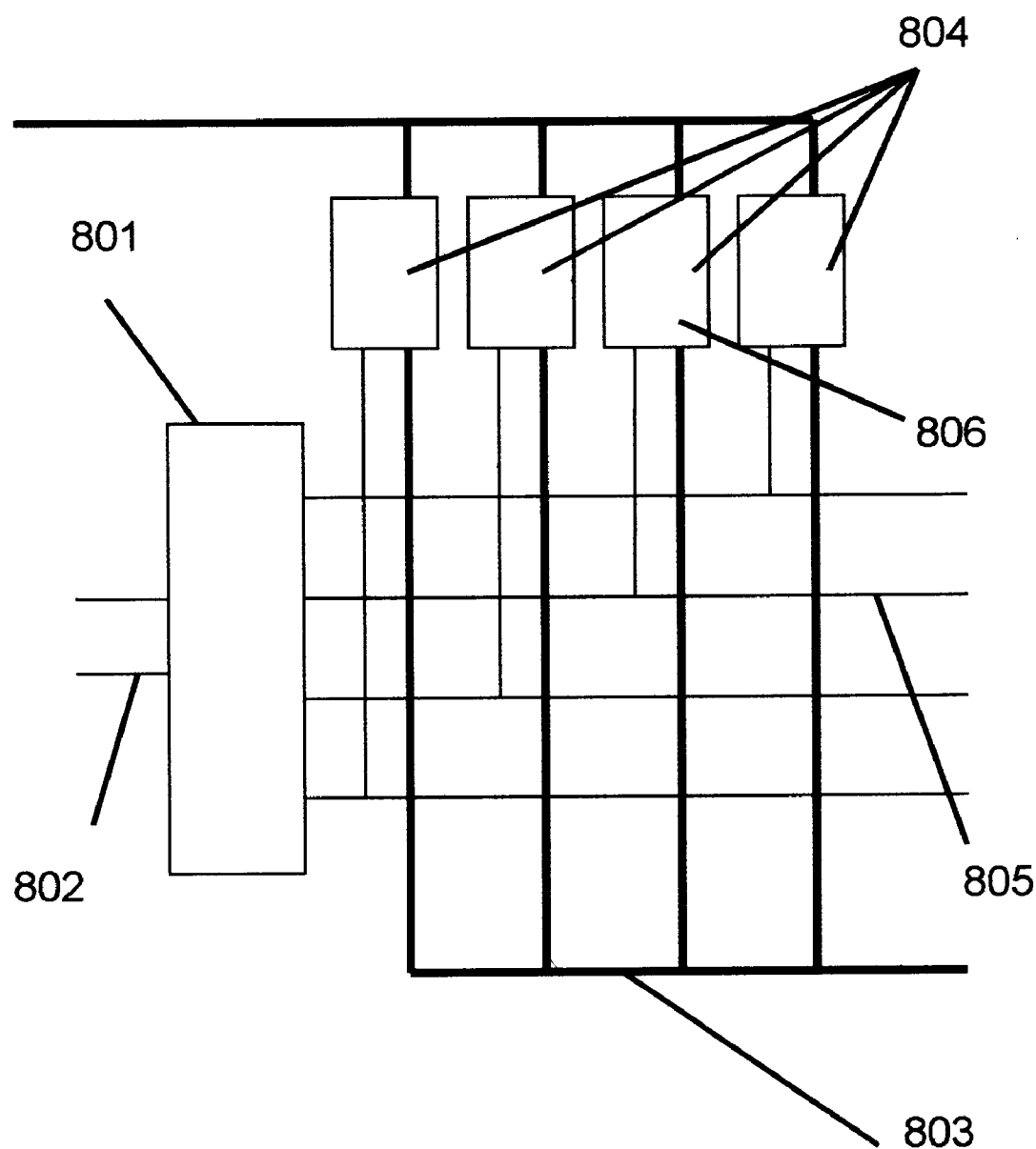
FIG. 8 shows a preferred embodiment of the present invention for a memory access controller for FIG. 7.

FIG. 8 shows a preferred embodiment of a memory access controller for the memory chip package in FIG. 7. In this embodiment, the memory address space is divided into four regions. Upon control signals, a decoder logic block 801 decodes two address lines 802 into four address region lines. These region lines are region disable lines, each one of which disables the selected memory unit in the first group of memory units. The data port 803 of the memory unit from the second group of memory units is used in place of the data segment from the disabled memory unit through a data selection unit 804.

As an example, assume that there are thirty-two data bits D0 to D31. Memory unit number 0 supports data bits D0 to D7. Memory unit number 1 supports data bits D8 to D15. Memory unit number 2 supports data bits D16 to D23. Memory unit number 3 supports data bits D24 to D31. If the two address lines are 01, the decoded line 805 will disable memory unit number 1, which supports data bits D8 to D15, will be disabled. The eight-bit data port 803 from the memory unit in the second group will be used to support data bits D8 to D15 through the selection unit 806.

Figure 9:
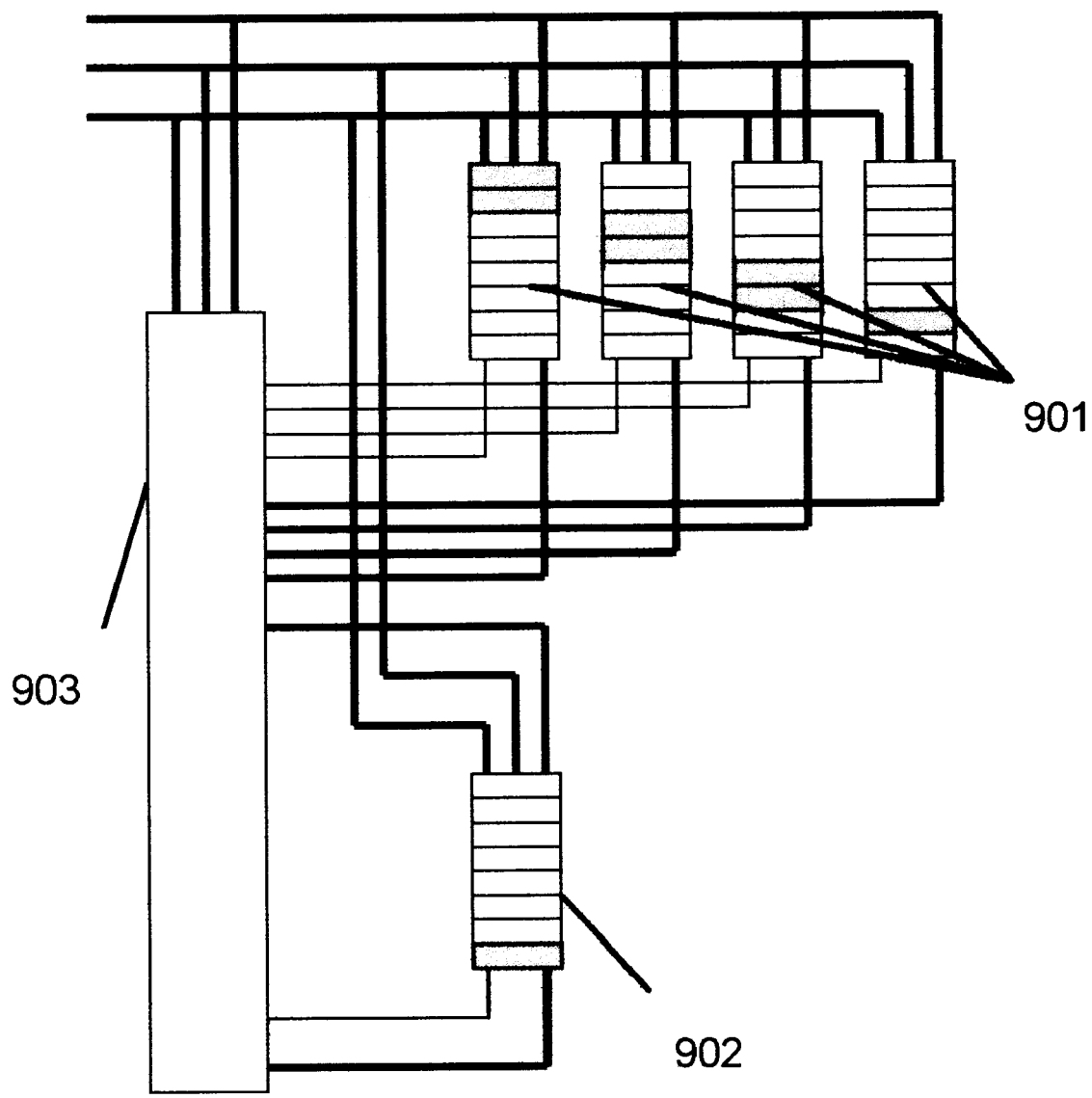
FIG. 9 shows a different preferred embodiment of the present invention for a memory module package.

FIG. 9 shows a different preferred embodiment of the present invention for a memory module package. The first group of memory chips contains four memory units 901. The second group of memory chips contains one memory unit 902. The memory access controller 903 controls the enabling of these two memory groups. In addition, the memory access controller 903 also provides an address mapping mechanism to reassign the address space for the memory units in order to place them in the appropriate memory regions.

Figure 10:
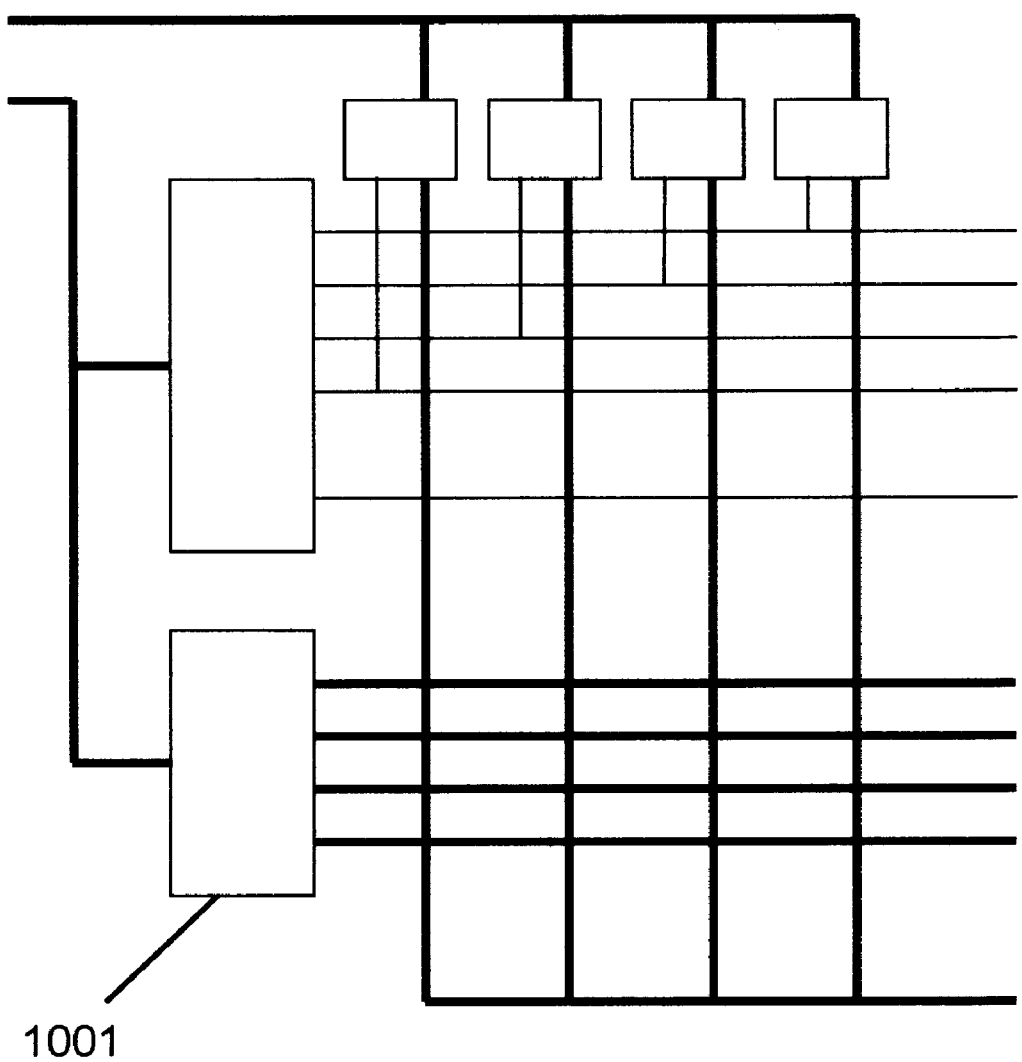
FIG. 10 shows a preferred embodiment of the present invention for a memory access controller for FIG. 9.

FIG. 10 shows a preferred embodiment of a memory access controller for the memory chip package in FIG. 9. In this embodiment, the memory address space is divided into four regions. Upon control signals, a decoder logic block decodes two address lines into four region disable lines similar to FIG. 8. The data lines are also controlled in similar manner. In addition, for each memory unit, there is an address mapping mechanism 1001 to reassign the address space.

Figure 11:
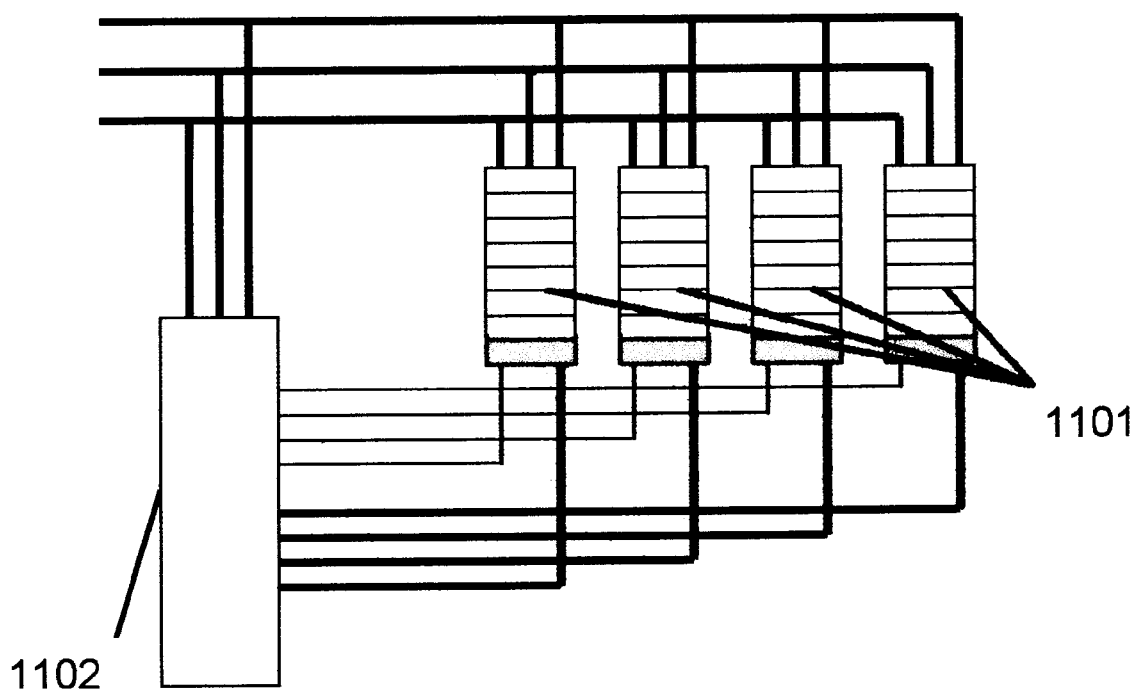
FIG. 11 shows another different preferred embodiment of the present invention for a memory module package.

FIG. 11 shows another different preferred embodiment of the present invention for a memory module package. It contains only one group of memory units 1101. The memory access controller 1102 provides an address mapping mechanism to reassign the address space for the memory units in order to place them in the appropriate memory regions such that the memory module can be used in a degraded manner. In this case, seven of the eight memory regions remain functional after the mapping.

I claim:

1. A memory chip or module package comprising:
   (a) a plurality of package data lines;
   (b) a plurality of package address lines;
   (c) a plurality of package control lines;
   (d) a first group of at least one memory sub-packages, each having a plurality of sub-package data lines, a plurality of sub-package address lines, and a plurality of sub-package control lines;
   (e) a second group of at least one memory sub-packages, each having a plurality of sub-package data lines, a plurality of sub-package address lines, and a plurality of sub-package control lines;
   (f) a memory access control unit;
   wherein the first group of memory sub-packages contain at least one defective memory sub-package;
   wherein the second group of memory sub-packages also contain at least one defective memory sub-package;
   wherein the second group of memory sub-packages occupy some or all overlapping memory address regions with the first group of memory sub-packages;
   wherein the memory access control unit enables either the first group of memory sub-packages or the second group of memory sub-packages, at the appropriate memory timing cycles, according to the memory address regions.

2. The memory package of claim 1, wherein the package is a semiconductor memory chip and the sub-package is a semiconductor memory device die.

3. The memory package of claim 1, wherein the package is a memory module and the sub-package is a memory chip.

4. The memory package of claim 1, further comprises a set of fixed or variable settings, which is a set of metal contacts, jumpers, resistors, or logic bits, for the memory access control unit to determine the selection on which group to enable.

5. A memory chip or module package comprising:
   (a) a plurality of package data lines;
   (b) a plurality of package address lines;
   (c) a plurality of package control lines;
   (d) a first group of at least one memory sub-packages, each having a plurality of sub-package data lines, a plurality of sub-package address lines, and a plurality of sub-package control lines;
   (e) a second group of at least one memory sub-packages, each having a plurality of sub-package data lines, a plurality of sub-package address lines, and a plurality of sub-package control lines;
   (f) a memory access control unit;
   wherein the first group of memory sub-packages contain at least one defective memory sub-package;
   wherein the second group of memory sub-packages occupy some or all overlapping memory address regions with the first group of memory sub-packages;
   wherein the memory access control unit disables at least one of the memory sub-packages in the first group and enable at least one of the memory sub-packages in the second group, at the appropriate memory timing cycles, according to the memory address regions.

6. The memory package of claim 5, wherein the package is a semiconductor memory chip and the sub-package is a semiconductor memory device die.

7. The memory package of claim 5, wherein the package is a memory module and the sub-package is a memory chip.

8. The memory package of claim 5, further comprises a set of fixed or variable settings, which is a set of metal contacts, jumpers, resistors, or logic bits, for the memory access control unit to determine the selection on which individual sub-packages to enable or disable.

9. A memory chip or module package comprising:
   (a) a plurality of package data lines;
   (b) a plurality of package address lines;
   (c) a plurality of package control lines;
   (d) a first group of at least one memory sub-packages, each having a plurality of sub-package data lines, a plurality of sub-package address lines, and a plurality of sub-package control lines;
   (e) a second group of at least one memory sub-packages, each having a plurality of sub-package data lines, a plurality of sub-package address lines, and a plurality of sub-package control lines;
   (f) a memory access control unit;
   (g) a memory address mapping unit;
   wherein the first group of memory sub-packages contain at least one defective memory sub-package;
   wherein the second group of memory sub-packages also contain at least one defective memory sub-package;
   wherein the second group of memory sub-packages occupy some or all overlapping memory address regions with the first group of memory sub-packages;

wherein the memory address mapping unit reassigns the memory address for at least one of the memory units in the first group or the second group of memory sub-packages;

wherein the memory access control unit enables either the first group of memory sub-packages or the second group of memory sub-packages, at the appropriate memory timing cycles, according to the memory address regions.

10. The memory package of claim 9, further comprises a set of fixed or variable settings, which is a set of metal contacts, jumpers, resistors, or logic bits, for the memory access control unit to determine the selection on which group to enable.

11. A memory chip or module package comprising:
  (a) a plurality of package data lines;
  (b) a plurality of package address lines;
  (c) a plurality of package control lines;
  (d) a first group of at least one memory sub-packages, each having a plurality of sub-package data lines, a plurality of sub-package address lines, and a plurality of sub-package control lines;
  (e) a second group of at least one memory sub-packages, each having a plurality of sub-package data lines, a plurality of sub-package address lines, and a plurality of sub-package control lines;
  (f) a memory address mapping unit;
  (g) a memory access control unit;

wherein the first group of memory sub-packages contain at least one defective memory sub-package;

wherein the second group of memory sub-packages occupy some or all overlapping memory address regions with the first group of memory sub-packages;

wherein the memory address mapping unit reassigns the memory address for at least one of the memory units in the first group or the second group of memory sub-packages;

wherein the memory access control unit disables at least one of the memory sub-packages in the first group and enable at least one of the memory sub-packages in the second group, at the appropriate memory timing cycles, according to the memory address regions.

12. The memory package of claim 11, further comprises a set of fixed or variable settings, which is a set of metal contacts, jumpers, resistors, or logic bits, for the memory access control unit to determine the selection on which individual sub-packages to enable or disable.

13. A memory chip or module package comprising:
  (a) a plurality of package data lines;
  (b) a plurality of package address lines;
  (c) a plurality of package control lines;
  (d) at least one memory sub-packages, each having a plurality of sub-package data lines, a plurality of sub-package address lines, and a plurality of sub-package control lines;
  (e) a memory address mapping unit;

wherein the memory sub-packages contain at least one defective memory sub-package;

wherein the memory address mapping unit reassigns the memory address for at least one of the memory sub-packages.

14. The memory package of claim 13, wherein the package is a semiconductor memory chip and the sub-package is a semiconductor memory device die.

15. The memory package of claim 13, wherein the package is a memory module and the sub-package is a memory chip.

16. A memory chip or module package comprising:
  (a) a plurality of package data lines;
  (b) a plurality of package address lines;
  (c) a plurality of package control lines;
  (d) at least one memory sub-packages, each having a plurality of sub-package data lines, a plurality of sub-package address lines, and a plurality of sub-package control lines;
  (e) a memory address mapping unit;

wherein the memory sub-packages contain at least one defective memory sub-package;

wherein the memory address mapping unit reassigns different memory addresses for at least two of the memory sub-packages.

17. The memory package of claim 16, wherein the package is a semiconductor memory chip and the sub-package is a semiconductor memory device die.

18. The memory package of claim 16, wherein the package is a memory module and the sub-package is a memory chip.

* * * * *